(12) United States Patent
Han et al.

(10) Patent No.: US 10,952,329 B2
(45) Date of Patent: Mar. 16, 2021

(54) COPPER CLAD LAMINATES AND METHOD FOR MANUFACTURING A PRINTED CIRCUIT BOARD USING THE SAME

(71) Applicant: SAMSUNG ELECTRO-MECHANICS CO., LTD., Suwon-Si (KR)

(72) Inventors: Youn-Gyu Han, Yongin-si (KR); Sang-jae Lee, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 649 days.

(21) Appl. No.: 15/133,471

(22) Filed: Apr. 20, 2016

(65) Prior Publication Data

US 2016/0338194 A1 Nov. 17, 2016

(30) Foreign Application Priority Data

May 12, 2015 (KR) .................. 10-2015-0065857

(51) Int. Cl.
*H05K 1/03* (2006.01)
*H05K 3/00* (2006.01)
(Continued)

(52) U.S. Cl.
CPC ......... *H05K 3/0038* (2013.01); *H05K 1/0373* (2013.01); *H05K 3/0035* (2013.01);
(Continued)

(58) Field of Classification Search
CPC ... H05K 2201/0358; H05K 2203/0156; H05K 3/022; H05K 3/025; H05K 2203/0152; H05K 2203/016; H05K 1/0373; H05K 3/007; H05K 3/205; H05K 3/4682; H05K 2203/0174; H05K 2203/0147; H05K 3/0038; H05K 3/0035; H05K 3/427
See application file for complete search history.

(56) References Cited

U.S. PATENT DOCUMENTS 6,240,636 B1* 6/2001 Asai ............... H05K 3/0038
205/126
6,391,220 B1* 5/2002 Zhang ............... B32B 37/26
156/247
(Continued)

FOREIGN PATENT DOCUMENTS

JP 54107985 A * 8/1979
JP 61-270151 A 11/1986
(Continued)

OTHER PUBLICATIONS

Machine translation of JP54107985A, published Aug. 1979. (Year: 1979).*
(Continued)

*Primary Examiner* — Monique R Jackson
(74) *Attorney, Agent, or Firm* — NSIP Law

(57) ABSTRACT

A copper clad laminate and a method to manufacture the same are provided. In one general aspect, a copper clad laminate include a first copper clad layer on a first surface of an insulating layer, and a second copper clad layer on a second surface of the insulating layer. The second copper clad layer includes polymer resin layer, a second copper layer, and a carrier foil layer.

3 Claims, 13 Drawing Sheets

(51) Int. Cl.
*H05K 3/02* (2006.01)
*H05K 3/42* (2006.01)
*H05K 3/10* (2006.01)

(52) U.S. Cl.
CPC .............. *H05K 3/022* (2013.01); *H05K 3/108* (2013.01); *H05K 3/427* (2013.01); *H05K 2201/0358* (2013.01); *H05K 2203/0156* (2013.01)

(56) References Cited

U.S. PATENT DOCUMENTS

| | | | | |
|---|---|---|---|---|
| 8,303,752 | B2* | 11/2012 | Kawabata | H05K 3/007 |
| | | | | 156/182 |
| 8,382,996 | B2 | 2/2013 | Narahashi et al. | |
| 2001/0019780 | A1* | 9/2001 | Obata | C25D 1/04 |
| | | | | 428/607 |
| 2002/0004124 | A1* | 1/2002 | Hirasawa | H05K 3/20 |
| | | | | 428/209 |
| 2004/0038049 | A1* | 2/2004 | Suzuki | B32B 15/08 |
| | | | | 428/457 |
| 2006/0272768 | A1* | 12/2006 | Kitamura | B32B 27/32 |
| | | | | 156/244.11 |
| 2007/0190882 | A1* | 8/2007 | Yu | B32B 37/0015 |
| | | | | 442/232 |
| 2009/0136725 | A1 | 5/2009 | Shimokawa et al. | |
| 2010/0065194 | A1* | 3/2010 | Nagase | H05K 3/4007 |
| | | | | 156/230 |
| 2010/0230142 | A1 | 9/2010 | Bamba et al. | |
| 2010/0230382 | A1* | 9/2010 | Narahashi | H05K 3/381 |
| | | | | 216/13 |
| 2012/0125667 | A1 | 5/2012 | Jung et al. | |

FOREIGN PATENT DOCUMENTS

| | | |
|---|---|---|
| JP | 8-216335 A | 8/1996 |
| JP | 2001-230519 A | 8/2001 |
| JP | 2006-022406 A | 1/2006 |
| JP | 2010-239133 A | 10/2010 |
| JP | 2012-109526 A | 6/2012 |
| WO | WO 2007/111268 A1 | 10/2007 |
| WO | WO 2009/054456 A1 | 4/2009 |
| WO | WO 2014/136763 A1 | 9/2014 |

OTHER PUBLICATIONS

Japanese Office Action dated Mar. 31, 2020 in corresponding Japanese Patent Application No. 2016-083799 (12 pages in English, 5 pages in Japanese).

Japanese Office Action dated Oct. 13, 2020 in counterpart Japanese Patent Application No. 2016-083799 (7 pages in English and 3 pages in Japanese).

* cited by examiner

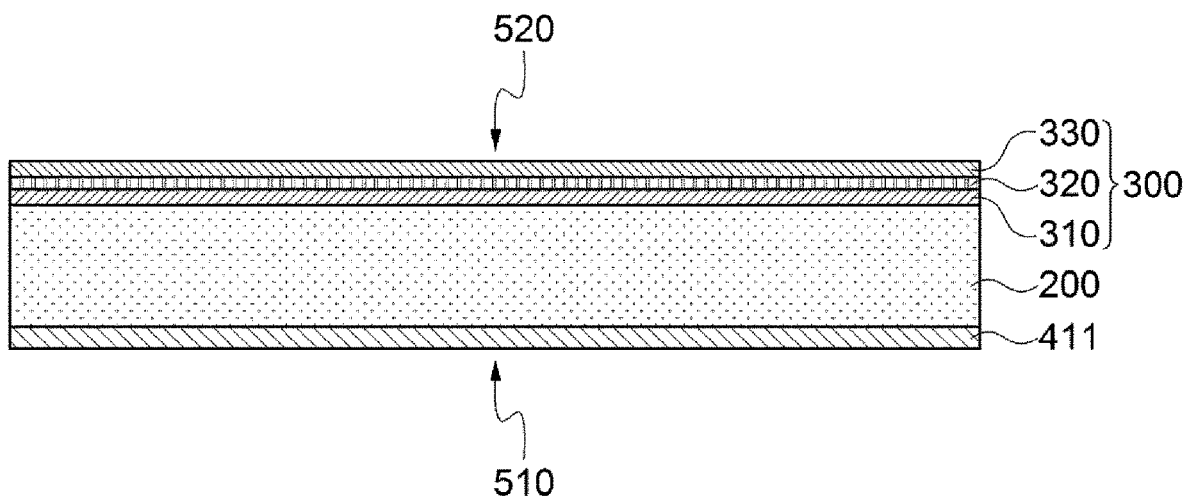
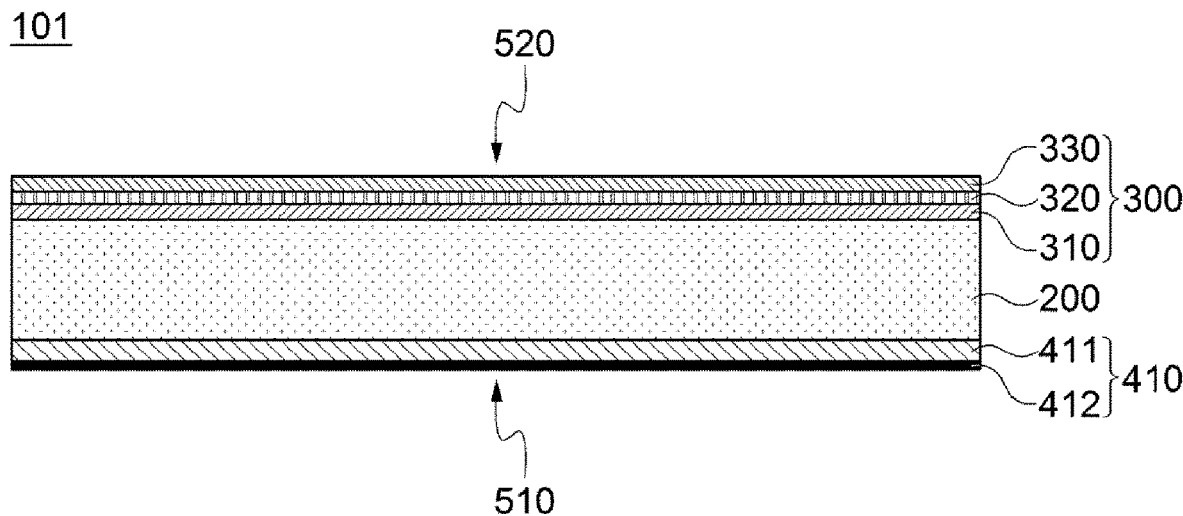

Laser

COPPER CLAD LAMINATES AND METHOD FOR MANUFACTURING A PRINTED CIRCUIT BOARD USING THE SAME

CROSS REFERENCE TO RELATED APPLICATION

This application claims the benefit under 35 USC 119(a) of Korean Patent Application No. 10-2015-0065857 filed on May 12, 2015 in the Korean Intellectual Property Office, the entire disclosure of which is incorporated herein by reference for all purposes.

BACKGROUND

Field

The following description relates to copper clad laminates and a method to manufacture a printed circuit board using the same.

2. Description of Related Art

In accordance with development of electronic devices with smaller sizes and lighter weights, high-speed communications and mass communications have been highly demanded. Further, demands on miniaturization of electronic components, increases in a number of components, and increases in a number of inputs and outputs have been also increased. Because electronic devices have gradually been lightened, thinned, and miniaturized, printed circuit boards have limited areas to mount electronic components, and high-density wiring-patterns are required.

A high-density circuit pattern is formed on an outer-layer circuit of a build-up layer rather than on a core layer on which an inter-layer circuit is formed because the inter-layer circuit is usually formed around a ground or power patterns and also materials used to form the inter-layer circuit are suitable for a tenting process or a modified semi-additive process.

The tenting process allows forming circuits easily using a subtractive process which eliminates unnecessary parts though an etching process, but it is limited in that, formation of fine-line circuit patterns is not possible. The modified semi-additive process allows forming circuits with line/space (L/S) 15/15 μm or greater on a thin seed layer by etching a copper foil. However, the modified semi-additive process still has technical problems to form circuits being less than L/S 15/15 μm. An embedded pattern process may need to be improved to bury a prepreg and increase adhesion with circuits in order to form fine-line patterns being less than L/S 15/15 μm.

Forming fine-line patterns of less than L/S 15/15 μm may be performed using a semi-additive process. The semi-additive process forms circuits using a plating process and does not cause a line-width difference between the upper part and lower part of the circuits. However, the semi-additive process has complicated processes and further requires an electroless plating process. Because the prepreg, which is a generally used core material and composes a cooper clad laminate, has a low plating adhesion. As a result, it is not suitable for forming patterns using the semi-additive process.

Forming fine via holes is also required to form high-density circuits in addition to forming fine patterns. Because it is difficult to form holes with 40 μm or less with a general $CO_2$ laser, a YAG laser or a pico-laser is used. However, a YAG laser or a pico-laser is more expensive compared to the $CO_2$ laser.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a copper clad laminate include a first copper clad layer on a first surface of an insulating layer, and a second copper clad layer on a second surface of the insulating layer. The second copper clad layer includes polymer resin layer, a second copper layer, and a carrier foil layer.

The polymer resin layer may comprise at least one selected from the group consisting of an epoxy resin, an acrylic resin, a polyimide, a polyamide-imide, a polyimide, a liquid crystal polymer, a cyclic olefin polymer or a mixture thereof.

The carrier foil layer may comprise at least one selected from the group consisting of a benzotriazole-based organic remover and a metallic remover such as a cobalt remover as a remover coating.

In another general aspect, a copper clad laminate includes a first copper clad layer on a first surface of an insulating layer, and a second copper clad layer on a second surface of the insulating layer. The first copper clad layer includes a first copper layer and a surface treatment layer, and the second copper clad layer includes a polymer resin layer, a second copper layer and a carrier foil layer.

The polymer resin layer may comprise at least one selected from the group consisting of an epoxy resin, an acrylic resin, a polyimide, a polyamide-imide, a polyimide, a liquid crystal polymer, a cyclic olefin polymer or a mixture thereof.

The carrier foil layer may comprise at least one selected from the group consisting of a benzotriazole-based organic remover and a metallic remover such as a cobalt remover as a remover coating.

The surface treatment layer may be formed by precipitating copper oxides through a blackening treatment on the first copper layer.

In another general aspect, a copper clad laminate includes a first copper clad layer on a first surface of an insulating layer, and a second copper clad layer on a second surface of the insulating layer. The first copper clad layer includes an ultra-thin copper foil on which a nickel oxide or a cobalt oxide is coated, and the second copper clad layer includes a polymer resin layer, a second copper layer and a carrier foil layer.

The polymer resin layer may comprise at least one selected from the group consisting of an epoxy resin, an acrylic resin, a polyimide, a polyamide-imide, a polyimide, a liquid crystal polymer, a cyclic olefin polymer or a mixture thereof.

The carrier foil layer may be coated with a benzotriazole-based organic remover or a metallic remover such as a cobalt remover.

In another general aspect, a copper clad laminate includes a first copper clad layer on a first surface of an insulating layer, and second copper clad layer on a second surface of the insulating layer. The first copper clad layer and the second copper clad layer independently include a polymer resin layer, a copper layer and a carrier foil layer.

The polymer resin layer may comprise at least one selected from the group consisting of an epoxy resin, an acrylic resin, a polyimide, a polyamide-imide, a polyimide, a liquid crystal polymer, a cyclic olefin polymer or a mixture thereof.

The carrier foil layer may be coated with a benzotriazole-based organic remover or a metallic remover such as a cobalt remover.

In another general aspect, a method for manufacturing a printed circuit board is provided. The method includes forming a copper clad laminate by forming a first copper clad layer on a first surface of an insulating layer and a second copper clad layer comprising a polymer resin layer, a carrier foil layer and a second copper layer on a second surface of the insulating layer. The method further includes forming a via hole on the surface of the first copper clad layer, eliminating the second copper clad layer except the polymer resin layer and forming a copper seed layer after etching the first copper clad layer, and forming a circuit pattern, and forming a via and an outer circuit on the first surface.

In another general aspect, a method for manufacturing a printed circuit board includes forming a copper clad laminate by forming a first copper clad layer comprising a first copper layer and a surface treatment layer on a first surface of an insulating layer, and a second copper clad layer comprising a polymer resin layer, a carrier foil layer and a second copper layer on a second surface of the insulating layer. The method further includes forming a via hole on the surface of the first copper clad layer; eliminating the second copper clad layer except the polymer resin layer and forming a copper seed layer after etching the first copper clad layer, and forming a circuit pattern, and forming a via and an outer circuit on the first surface.

In one general aspect, a method for manufacturing a printed circuit board includes forming a copper clad laminate by forming a first copper clad layer comprising an ultra-thin copper foil on which a nickel oxide or a cobalt oxide is coated on the first surface of an insulating layer, and a second copper clad layer comprising a polymer resin layer, a carrier foil layer and a second copper layer on a second surface of the insulating layer. The method further includes forming a via hole on the surface of the first copper clad layer, eliminating the second copper clad layer except the polymer resin layer and forming a copper seed layer after etching the first copper clad layer, and forming a circuit pattern, and forming a via and an outer circuit on the first surface.

In one general aspect a method for manufacturing a printed circuit board includes forming a copper clad laminate by forming a first copper clad layer comprising a polymer resin layer, a carrier foil layer and a copper layer on a first surface of an insulating layer and a second copper clad layer comprising a polymer resin layer, a carrier foil layer and a copper layer on a second surface of the insulating layer. The method further includes forming a via hole on one surface of the second copper clad layer, eliminating the second copper clad layer except the polymer resin layer and forming a copper seed layer after etching the first copper clad layer, and forming a circuit pattern, and forming a via and an outer circuit on the first surface and the second surface.

Forming of the via hole may comprise irradiating laser on the surface of the second copper clad layer.

Forming of the copper seed layer may comprise electroless plating after etching the first copper clad layer.

Forming of the circuit pattern may comprise a semi-additive process.

Other features and aspects will be apparent from the following detailed description, the drawings, and the claims.

BRIEF DESCRIPTION OF THE DRAWINGS

FIG. 11 illustrates a sectional view of a first copper layer and a second copper clad layer formed according to a method for manufacturing a printed circuit board, in accordance with an embodiment.

FIG. 12 illustrates a sectional view of a surface treatment layer formed through a surface treatment on the first copper layer formed according to a method for manufacturing a printed circuit board, in accordance with an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
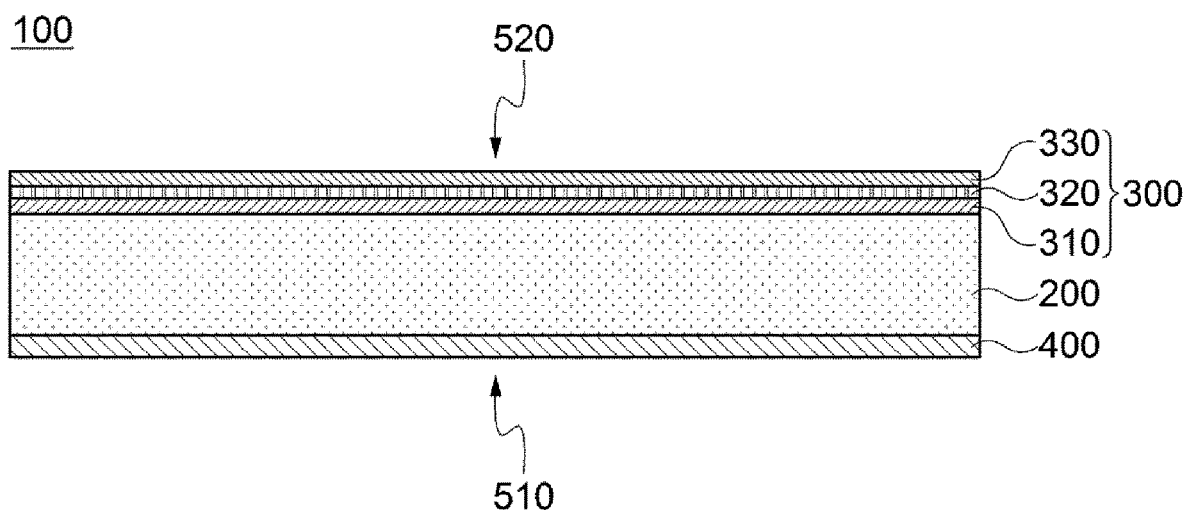
FIG. 1 illustrates a sectional view of a copper clad laminate, in accordance with an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

The terms used in the description are intended to describe certain embodiments only, and shall by no means restrict the present disclosure. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

When it is described that a method includes series of steps, a sequence of the steps is not a sequence in which the steps should be performed in the sequence, an arbitrary technical step may be omitted and/or another arbitrary step, which is not disclosed herein, may be added to the method.

Hereinafter, certain embodiments of the present disclosure will be described in detail with reference to the accompanying drawings.

As used herein, the term "fine circuit pattern" refers to a circuit pattern having an L/S of less than about 15 μm.

Various embodiments disclosed herein may include an insulating layer as a structural element of a printed circuit board. The insulating layer may include a reinforcing material, a filler and a resin, and the reinforcing material may be glass fiber fabrics, glass fiber nonwovens, carbon fiber fabrics or organic polymer fiber fabrics.

In various embodiments disclosed herein a printed circuit board may include a filler. In such embodiments, the filler may be silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, calcium zirconate or a mixture thereof, but the filler may not be limited thereto.

Various embodiments of the printed circuit disclosed herein may include a polymer resin. In such embodiments, the polymer resin layer may be formed of an epoxy resin, an acrylic resin, a polyimide, a polyamide-imide, a polyimide, a liquid crystal polymer, a cyclic olefin polymer or a mixture thereof. The polymer resin layer may be formed of a varnished polymer which is soluble in epoxy and organic solvents.

In various embodiments of the printed circuit board disclosed herein, a carrier foil layer may be present. In such embodiments, the carrier foil layer may be coated with a benzotriazole-based organic remover or a metallic remover such as a cobalt remover.

While the disclosure may refer to various embodiments using cardinal numbers as first or second, a person having ordinary skill in the art will appreciate that the numbering is merely to differentiate one embodiment from another and does not indicate the order of the embodiments.

Figure 9:
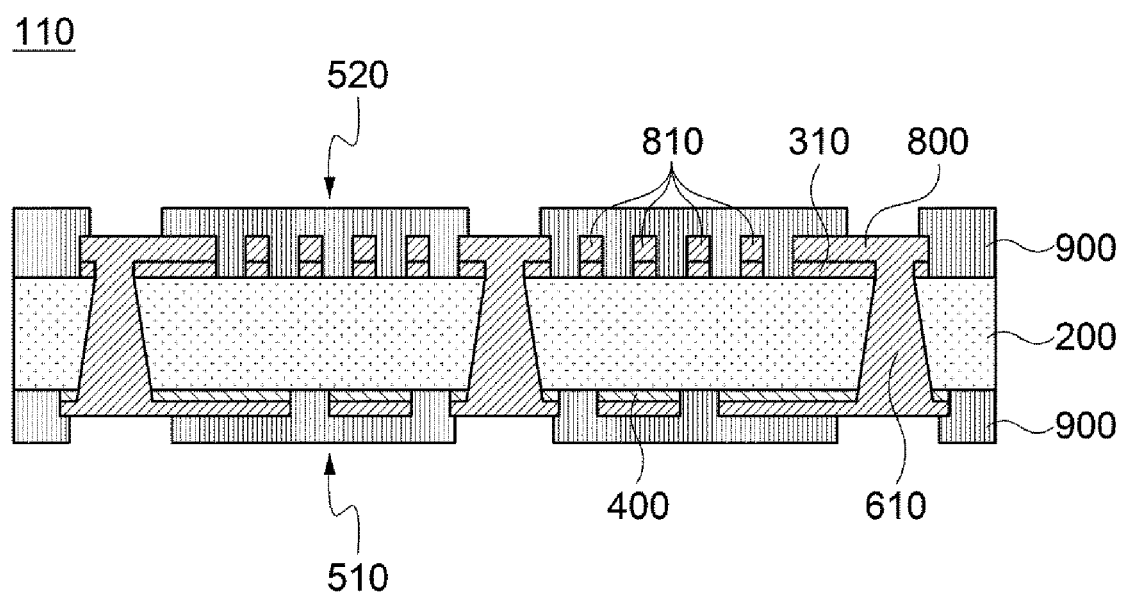
FIG. 9 illustrates a sectional view illustrating a fine circuit pattern and a solder resist formed according to a method for manufacturing a printed circuit board, in accordance with an embodiment.

FIG. 1 illustrates a sectional view of a first example of a copper clad laminate and FIG. 9 illustrates a sectional view of a printed circuit board prepared using the first example of a method for manufacturing a printed circuit board.

Referring to FIG. 1 and FIG. 9, a copper clad laminate 100 according to an example includes an insulating layer 200, a first copper clad layer 400 formed on a first surface 510 of the insulating layer 200 and a second copper clad layer 300 formed on a second surface 520 of the insulating layer 200, wherein the second copper clad layer 300 may include a polymer resin layer 310, a second copper layer 320 and a carrier foil layer 330.

The first copper clad layer 400 may include Cu and the second copper clad layer 300 may include the polymer resin layer 310, the second copper layer 320, and the carrier foil layer 330 which are formed in order outwardly from the insulating layer 200.

The polymer resin layer 310 may be a polymer resin layer which is amenable to a semi-additive process and have an excellent adhesion with a metal seed layer during the semi-additive process so that it allows implementing fine circuit patterns 810 of the printed circuit board 110.

Figure 2:
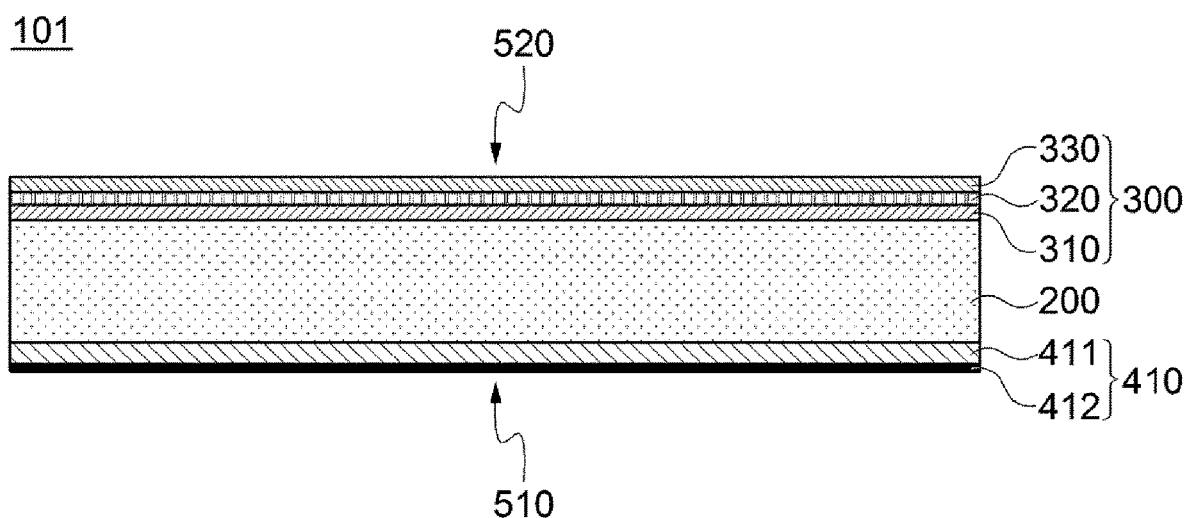
FIG. 2 illustrates a sectional view of a copper clad laminate, in accordance with an embodiment.
Figure 15:
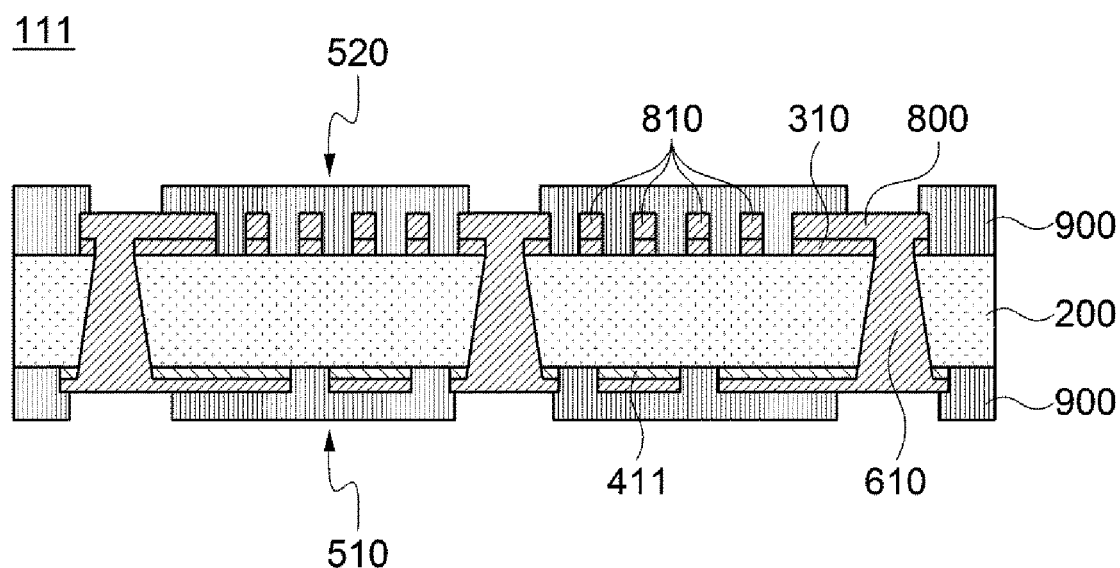
FIG. 15 illustrates a sectional view of a fine circuit pattern and a solder resist formed according to a method for manufacturing a printed circuit board, in accordance with an embodiment.

FIG. 2 illustrates a sectional view of a second example of a copper clad laminate and FIG. 15 is a sectional view illustrating a printed circuit board prepared according to a second example of a method for manufacturing a printed circuit board.

Referring to FIG. 2 and FIG. 15, a copper clad laminate 101 includes an insulating layer 200, a first copper clad layer 410 formed on a first surface 510 of the insulating layer 200, and a second copper clad layer 300 formed on a second surface 520 of the insulating layer 200, wherein the first copper clad layer 410 may include a first copper layer 411 and a surface treatment layer 412, and the second copper clad layer 300 may include a polymer resin layer 310, a second copper layer 320 and a carrier foil layer 330.

The first copper clad layer 410 may include the first copper layer 411 and the surface treatment layer 412, wherein the surface treatment layer 412 may be formed by oxidizing the surface of the first copper layer 411 through a blackening treatment to precipitate copper oxides such as CuO, $Cu_2O$ and the like on the copper layer. The surface of the copper layer may be uniformly oxidized by an oxidizing solution such as $ClO_2$ (Chlorite) after etching the surface with $H_2SO_4$ or the like.

The surface treatment layer 412 may be red or black depending on a ratio between CuO and $Cu_2O$ precipitated on the surface. Such colors reduce reflection of laser to form fine via holes when the via holes are formed using the laser.

The second copper clad layer 300 includes the polymer resin layer 310, the second copper layer 320, and the carrier foil layer 330 which are formed in order outwardly from the insulating layer 200.

The polymer resin layer 310 is a polymer resin layer, which is amenable to a semi-additive process and have an excellent adhesive with a metal seed layer during the semi-additive process so that it allows implementing fine circuit patterns 810 of the printed circuit board 110.

Figure 3:
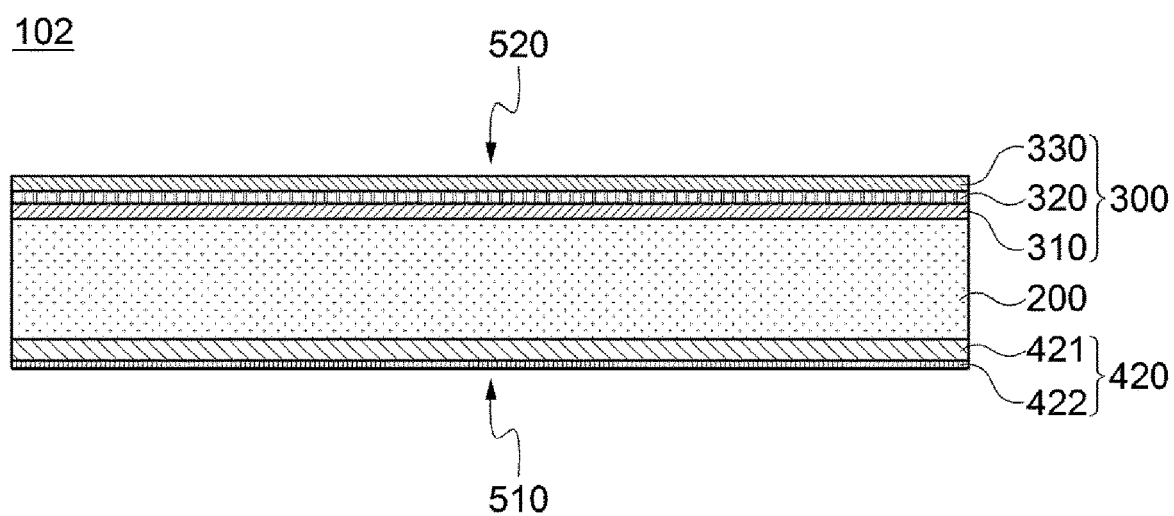
FIG. 3 illustrates a sectional view of a copper clad laminate, in accordance with an embodiment.
Figure 20:
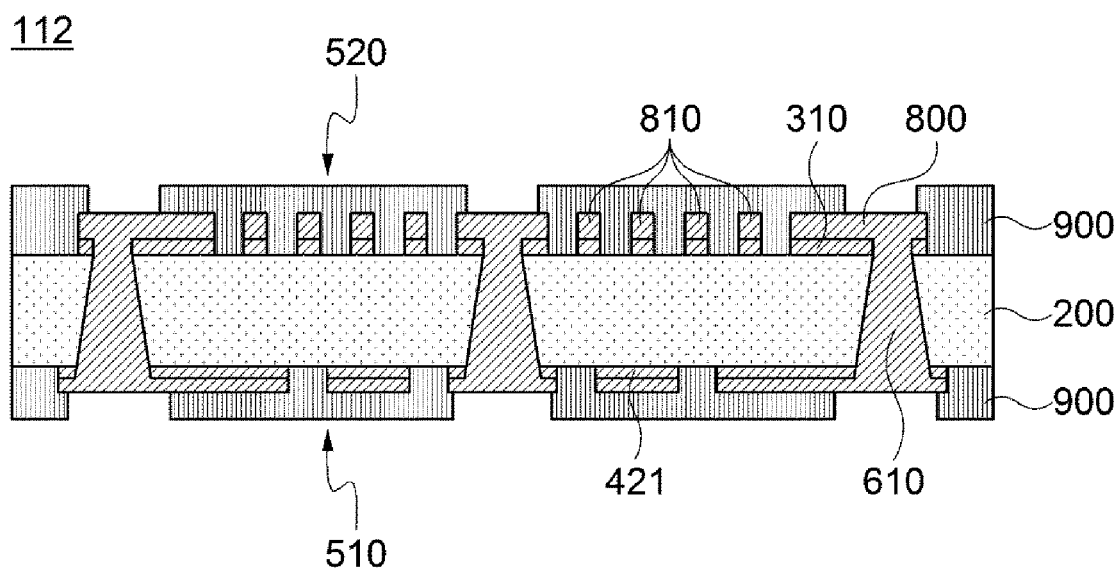
FIG. 20 illustrates a sectional view of a fine circuit pattern and a solder resist formed according to a method for manufacturing a printed circuit board, in accordance with an embodiment.

FIG. 3 illustrates a sectional view of a third example of a copper clad laminate and FIG. 20 illustrates a sectional view of a printed circuit board prepared according to a third example of a method for manufacturing a printed circuit board.

Referring to FIG. 3 and FIG. 20, a copper clad laminate 102, according to an example, includes an insulating layer 200, a first copper clad layer 420 formed on a first surface 510 of the insulating layer 200 and a second copper clad layer 300 formed on a second surface 520 of the insulating layer 200, wherein the first copper clad layer 420 may include an ultra-thin copper foil 421 and a metallic oxide coating layer 422 and the second copper clad layer 300 may include a polymer resin layer 310, a second copper layer 320 and a carrier foil layer 330.

The first copper clad layer 420 includes the ultra-thin copper foil 421 and the metallic oxide coating layer 422, wherein the metallic oxide coating layer 422 may be formed by coating the ultra-thin copper foil 421 with nickel oxide or cobalt oxide to increase laser absorbance, which can form fine via holes when the via hole is formed using the laser.

The second copper clad layer 300 includes the polymer resin layer 310, the second copper layer 320, and the carrier foil layer 330, which are formed in order outwardly from the insulating layer 200.

The polymer resin layer 310 may be a polymer resin layer which is amenable to a semi-additive process and have an excellent adhesion with a metal seed layer during the semi-additive process so that it allows implementing fine circuit patterns 810 of the printed circuit board 110.

Figure 4:
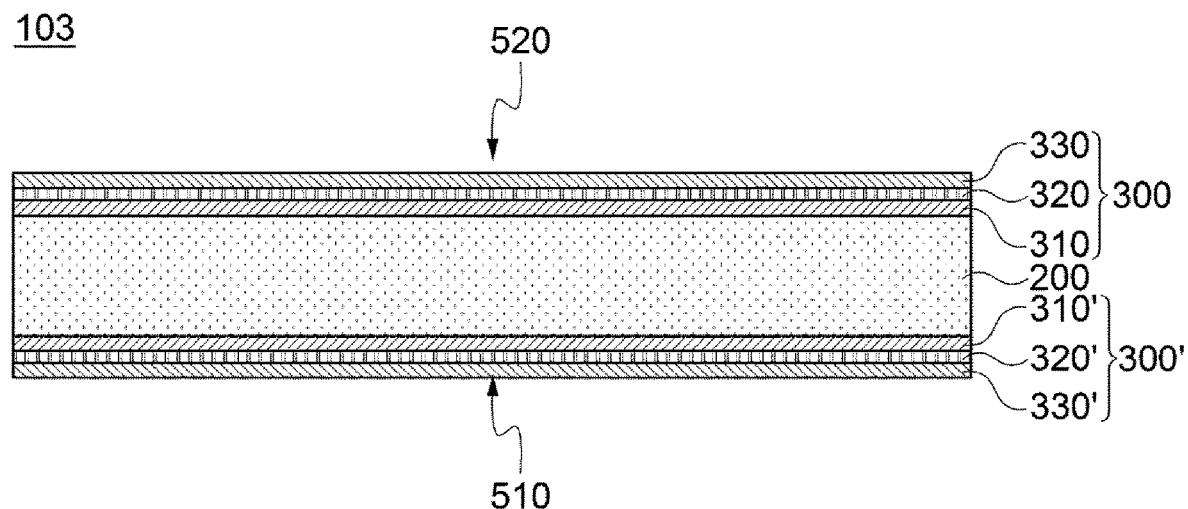
FIG. 4 illustrates a sectional view of a copper clad laminate, in accordance with an embodiment.
Figure 25:
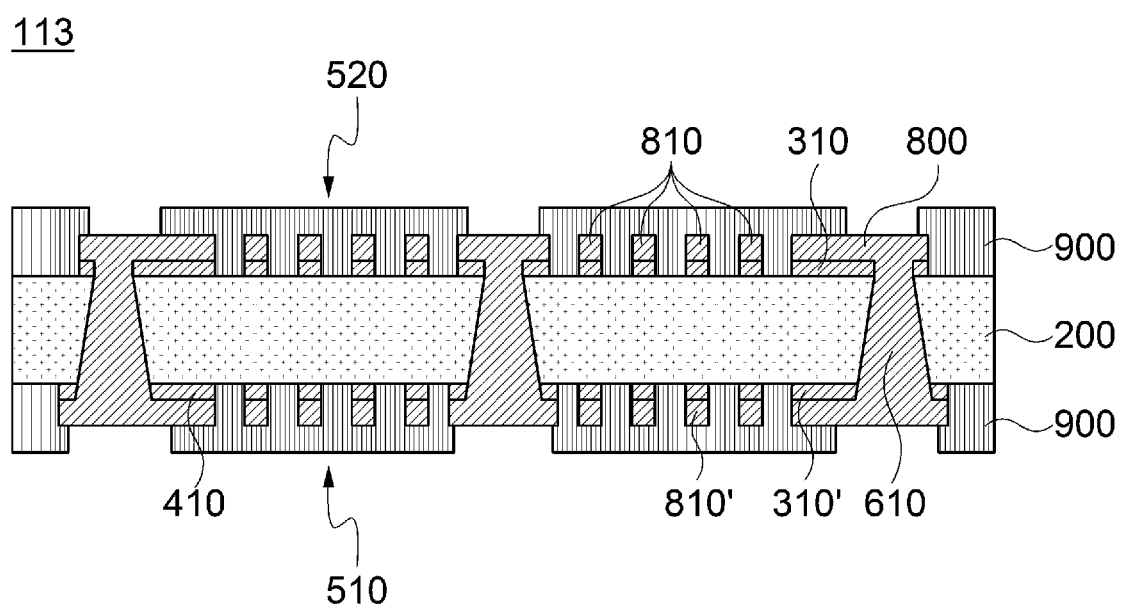
FIG. 25 illustrates a sectional view of a fine circuit pattern and a solder resist formed on one surface and the other surface of the insulating layer formed according to a method for manufacturing a printed circuit board, in accordance with an embodiment.

FIG. 4 illustrates a sectional view of a fourth example of a copper clad laminate and FIG. 25 illustrates a sectional view of a printed circuit board prepared according to a fourth example of a method for manufacturing a printed circuit board.

Referring to FIG. 4 and FIG. 25, a copper clad laminate 103 according to an example includes an insulating layer 200 and a first copper clad layer 300 formed on a first surface 510 of the insulating layer 200 and a second copper clad layers 300' formed on a second surface 520 of the insulating layer 200, wherein the first copper clad layer 300 and the second copper clad layer 300' may include polymer resin layers 310, 310', copper layers 320, 320' and carrier foil layers 330, 330', respectively.

The first copper clad layer 300 and the second copper clad layer 300' may be formed by forming the polymer resin layers 310, 310', the copper layers 320, 320', and the carrier foil layers 330, 330' in order outwardly from the insulating layer 200 on the first and the second surfaces of the insulating layer 200, respectively.

The polymer resin layers 310, 310' are formed of an epoxy resin, an acrylic resin, a polyimide, a polyamide-imide, a polyimide, a liquid crystal polymer, a cyclic olefin polymer or a mixture thereof. The polymer resin layers 310, 310' may be formed of a varnished polymer, which is soluble in epoxy and organic solvents.

The polymer resin layer 310, 310' may be a polymer resin layer, which is amenable to a semi-additive process and have an excellent adhesive with a metal seed layer during the semi-additive process so that it allows implementing fine circuit patterns 810 of the printed circuit board 110.

The carrier foil layers 330, 330' may be coated with a benzotriazole-based organic remover or a metallic remover such as a cobalt remover.

Figure 5:
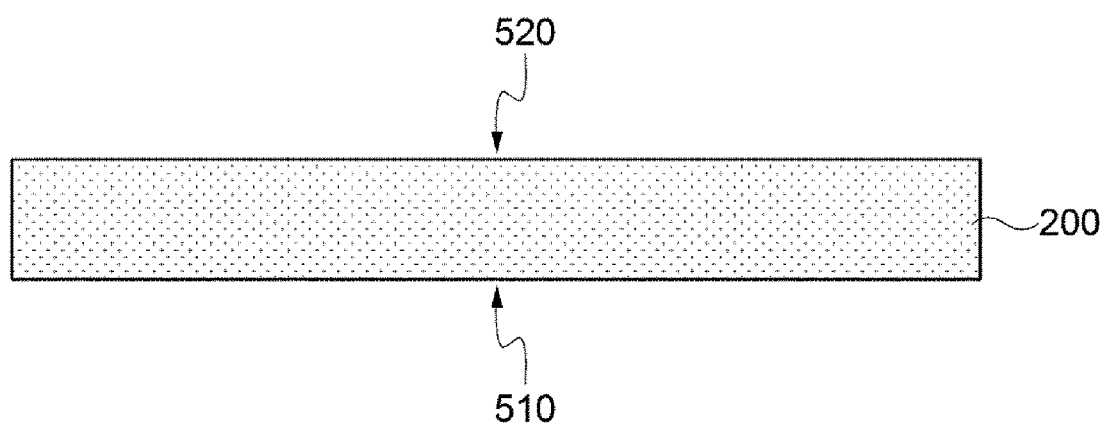
FIG. 5 illustrates a sectional view of an insulating layer formed according to a method for manufacturing a printed circuit board, in accordance with an embodiment.
Figure 6:
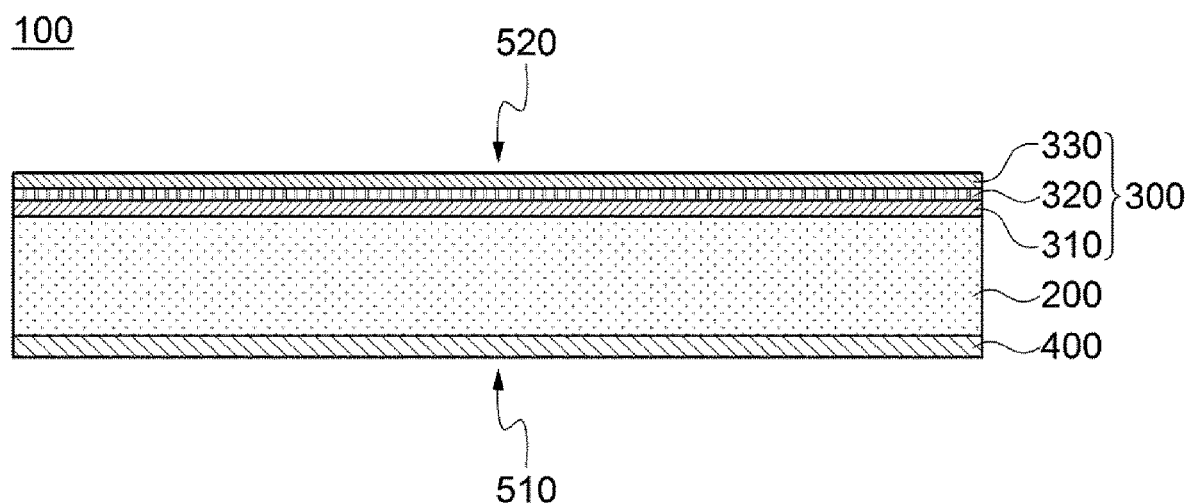
FIG. 6 illustrates a sectional view of a first copper clad layer and a second copper clad layer formed according to a method for manufacturing a printed circuit board, in accordance with an embodiment.
Figure 7:
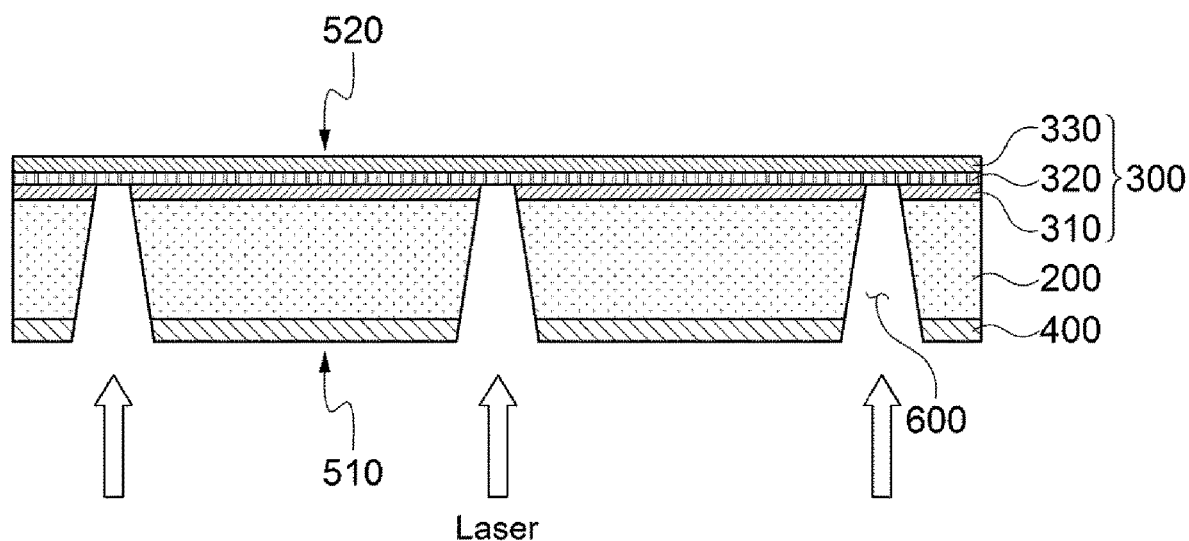
FIG. 7 illustrates a sectional view of a via hole formed using a laser according to a method for manufacturing a printed circuit board, in accordance with an embodiment.
Figure 8:
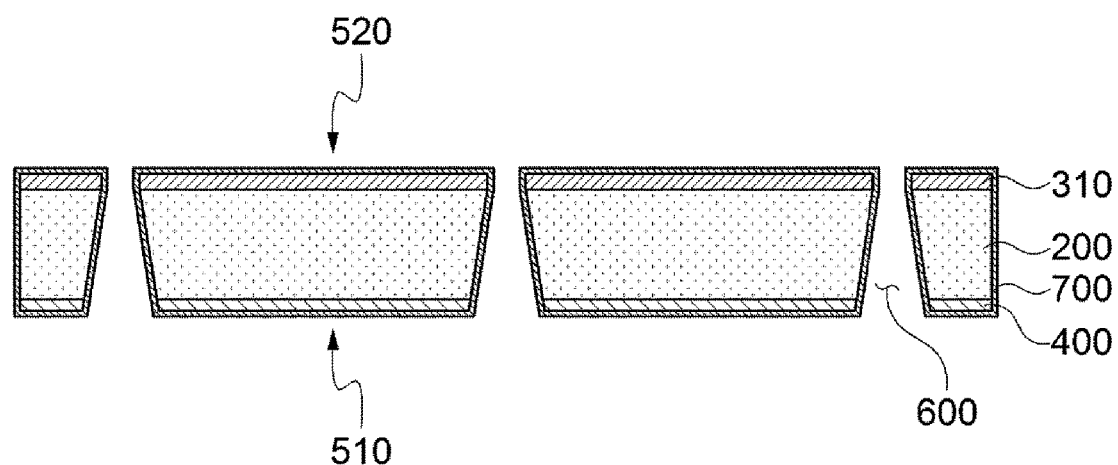
FIG. 8 illustrates a sectional view of a seed layer formed according to of a method for manufacturing a printed circuit board, in accordance with an embodiment.

FIG. 5 illustrates a sectional view of an insulating layer formed according to a first example of a method for manufacturing a printed circuit board, FIG. 6 illustrates a sectional view of a first copper clad layer and a second copper clad layer formed according to a first example of a method for manufacturing a printed circuit board, FIG. 7 illustrates a sectional view of a via hole formed using a laser in a first example of a method for manufacturing a printed circuit board, FIG. 8 illustrates a sectional view of a seed layer formed according to a first example of a method for manufacturing a printed circuit board, and FIG. 9 illustrates a sectional view of a fine circuit pattern and a solder resist formed according to a first example of a method for manufacturing a printed circuit board.

Referring to FIGS. 5-9, a method for manufacturing a printed circuit board according to an example includes forming a copper clad laminate by forming a first copper clad layer on a first surface of an insulating layer and a second copper clad layer including a polymer resin layer, a carrier foil layer and a second copper layer on a second surface of the insulating layer, forming a via hole on the surface of the first copper clad layer, eliminating the second copper clad layer except the polymer resin layer and forming a copper seed layer after etching the first copper clad layer, and forming a fine circuit pattern and forming a via and an outer circuit on one surface. Forming of the via hole may comprise irradiating laser on the surface of the second copper clad layer. Forming of the copper seed layer may comprise electroless plating after etching the first copper clad layer. Forming of the circuit pattern may comprise a semi-additive process.

A process to form a copper clad laminate by forming a first copper clad layer on the first surface of the insulating layer and a second copper clad layer including a polymer resin layer includes forming a copper clad laminate by laminating the first copper clad layer 400 on the first surface 510 of the insulating layer 200 and the second copper clad layer 300 on the second surface 520 of the insulating layer 200.

The second copper clad layer 300 is formed by forming the polymer resin layer 310, the second copper layer 320, and the carrier foil layer 330 in order outwardly from the insulating layer 200.

A process to form a via hole by irradiating laser on the surface of the first copper clad layer may include forming a via hole by irradiating laser on the first surface 510 of the copper clad laminate 100 of FIG. 6.

The laser may be a YAG laser, a $CO_2$ laser or a pico-laser, but it may not limited thereto. The choice of the laser may depend on factors such as, for example, the required diameter of the via hole, cost of manufacturing the printed circuit board, materials being using the in the manufacturing process, and so forth.

When a via hole is made using laser, a diameter of the bottom part of the via hole is generally smaller than that of the entrance part. However, in this example, because the via hole is formed from the first surface 510 to the second surface 520 of the copper clad laminate, the diameter of the entrance part of the via hole from the second surface 520 is smaller which allows forming fine via holes 600 and further forming fine vias 610 and fine patterns 810 on the second surface 520.

The via hole 600 is etched to the polymer resin layer 310.

A process to eliminate the second copper clad layer, except the polymer resin layer and forming a copper seed layer by electroless plating after etching the first copper clad layer, includes eliminating the second copper layer 320 and the carrier foil layer 330 using a detaching process and the first copper clad layer 400 using an etching process.

In an example, the first copper clad layer may not be eliminated completely as shown in FIG. 8. In such an example, the remaining first copper clad layer may improve the adhesion between the copper seed layer and the insulating layer when the copper seed layer is formed by electroless plating.

The copper seed layer 700 on the second surface 520 is formed by electroless plating. In an example, the copper seed layer 700 may function as a seed layer to form an outer circuit pattern 800, a fine pattern 810, and the via 610.

The copper seed layer 700 on the second surface 520 is plated on the polymer resin layer 310 to facilitate forming the fine pattern 810 through the semi-additive process because the polymer resin layer 310 improves adhesion with the insulating layer 200.

A solder resist 900 is formed and an opening part is formed therein. A build-up layer and a circuit pattern may be further formed to implement a multilayer printed circuit board if needed.

Figure 10:
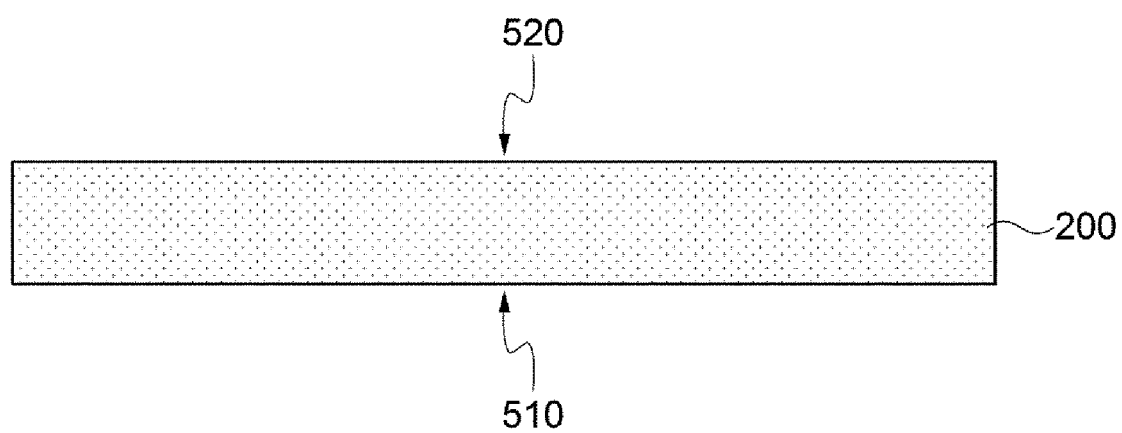
FIG. 10 illustrates a sectional view of an insulating layer formed according to a method for manufacturing a printed circuit board, in accordance with an embodiment.
Figure 13:
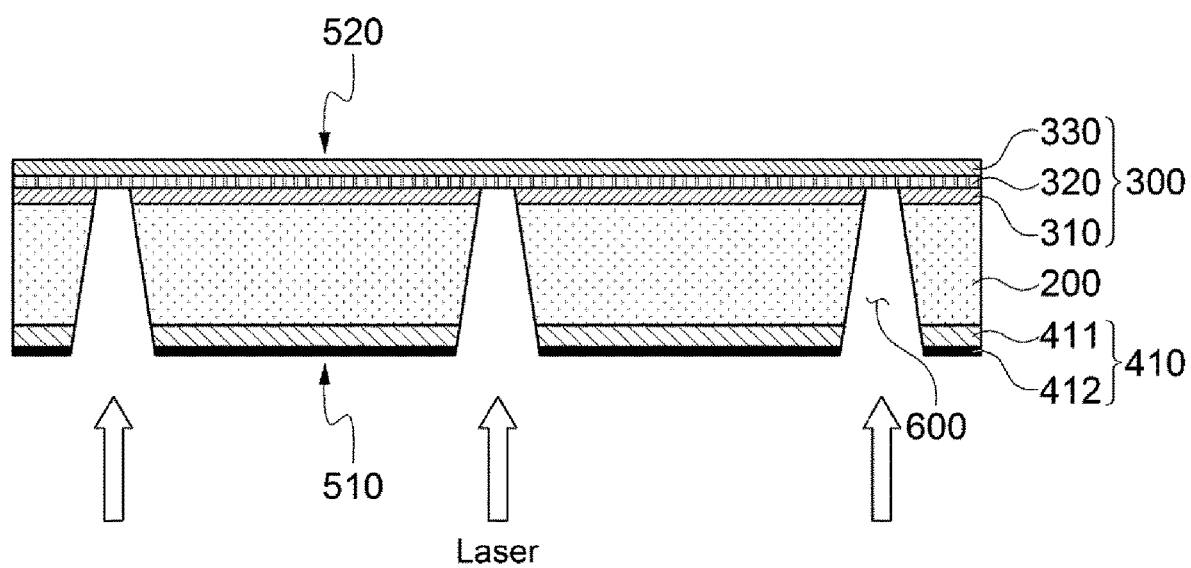
FIG. 13 illustrates a sectional view of a via hole formed using a laser according to a method for manufacturing a printed circuit board, in accordance with an embodiment.
Figure 14:
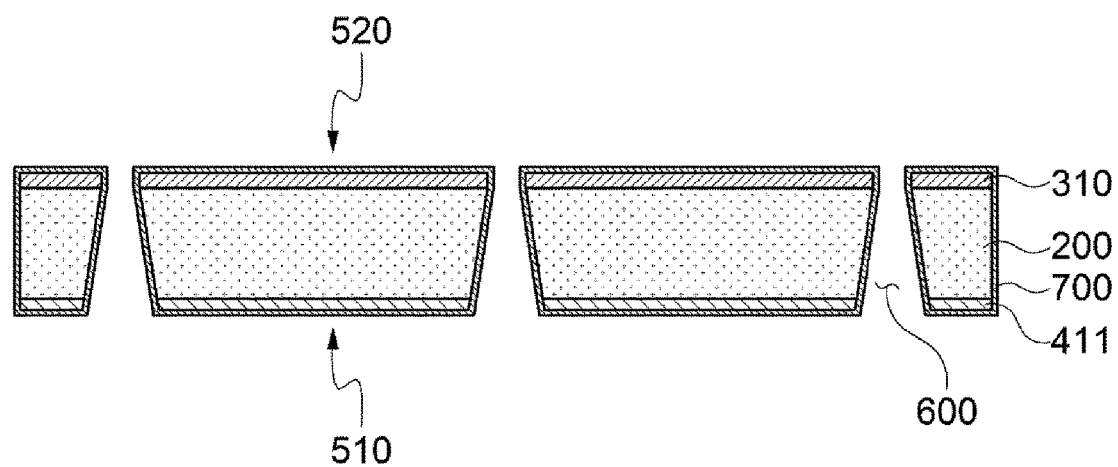
FIG. 14 illustrates a sectional view of a seed layer formed according to a method for manufacturing a printed circuit board, in accordance with an embodiment.

FIG. 10 illustrates a sectional view of an insulating layer formed according to a second example of a method for manufacturing a printed circuit board. FIG. 11 illustrates a sectional view of a first copper layer and a second copper clad layer formed according to a second example of a method for manufacturing a printed circuit board. FIG. 12 illustrates a sectional view of a surface treatment layer formed through a surface treatment on the first copper layer formed according to a second example of a method for manufacturing a printed circuit board. FIG. 13 illustrates a sectional view of a via hole formed using a laser according to a second example of a method for manufacturing a printed circuit board. FIG. 14 illustrates a sectional view of a seed layer formed according to a second example of a method for manufacturing a printed circuit board. FIG. 15 illustrates a sectional view of a fine circuit pattern and a solder resist formed according to a second example of a method for manufacturing a printed circuit board.

Referring to FIGS. 10-15, a method for manufacturing a printed circuit board, according to an example, includes forming a copper clad laminate by forming a first copper clad layer including a first copper layer and a surface treatment layer on a first surface of an insulating layer, and a second copper clad layer including a polymer resin layer, a carrier foil layer and a second copper layer on a second surface of the insulating layer, forming a via hole on a surface of the first copper clad layer, eliminating the second copper clad layer except the polymer resin layer and forming a copper seed layer after etching the first copper clad layer, and forming a circuit pattern and forming a via and an outer circuit on the first surface. Forming of the via hole may comprise irradiating laser on the surface of the second copper clad layer. Forming of the copper seed layer may comprise electroless plating after etching the first copper clad layer. Forming of the circuit pattern may comprise a semi-additive process.

A process to form a copper clad laminate by forming a first copper clad layer on the first surface of the insulating layer and a second copper clad layer including a polymer resin layer, a carrier foil layer and a second copper layer on the second surface of the insulating layer includes forming the first copper clad layer 400 by laminating the first copper layer 411 and the surface treatment layer 412 in order outwardly on one surface 510 of the insulating layer 200 and forming the second copper clad layer 300 on the second surface 520 of the insulating layer.

The second copper clad layer 300 is formed by sequentially laminating the polymer resin layer 310, the second copper layer 320, and the carrier foil layer 330 outwardly from the insulating layer 200.

The surface treatment layer 412 is formed by blackening the surface of the first copper layer 411 to precipitate copper oxides such as $CuO$, $Cu_2O$ and the like on the surface of the copper layer. The surface of the copper layer may be uniformly oxidized by an oxide solution such as $ClO_2$ (Chlorite) after etching the surface with $H_2SO_4$.

The surface treatment layer 412 may be red or black depending on a ratio between $CuO$ and $Cu_2O$ precipitated on the surface and such colors reduce reflection of laser to form fine via holes when the via holes are formed using the laser.

A process to form a via hole by irradiating laser on the surface of the first copper clad layer may include forming a via hole 600 by irradiating laser on one surface 510 of the copper clad laminate 101 in FIG. 12.

The laser may be a YAG laser, a $CO_2$ laser or a pico-laser, but it may not limited thereto.

In examples where the surface treatment layer 412 is red or black, a $CO_2$ laser, which performs the process a relatively low cost, is used because the reflection of the laser through the surface treatment layer 412 is reduced, thereby reducing the cost of the process without affecting the L/S of the circuit pattern.

When a via hole is made using laser, a diameter of the bottom part of the via hole is generally smaller than that of the entrance part. However, in this example, because the via hole is formed from first surface 510 to the second surface 520 of the copper clad laminate, the diameter of the entrance part of the via hole from the second surface 520 is smaller which allows forming fine via holes 600 and further forming fine vias 610 and fine patterns 810 on the second surface 520.

The via hole 600 may be etched to the polymer resin layer 310.

A process to eliminate the second copper clad layer except the polymer resin layer and forming a copper seed layer by electroless plating after etching the first copper clad layer may include eliminating the second copper layer 320 and the carrier foil layer 330 using a detaching process and the first copper clad layer 400 using an etching process.

In some examples, the surface treatment layer 412 of the first copper clad layer may be completely eliminated, but the first copper layer 411 may not be completely eliminated as shown in FIG. 14. In such examples, the remaining first copper layer 411 improves the adhesion between the copper seed layer and the insulating layer when the copper seed layer is formed by electroless plating.

The copper seed layer 700 on the second surface 520 is formed by electroless plating. In an example, the copper seed layer 700 may function as a seed layer to form an outer circuit pattern 800, a fine pattern 810, and the via 610.

The copper seed layer 700 on the other surface 520 may be plated on the polymer resin layer 310 to facilitate forming the fine pattern 810 through the semi-additive process because the polymer resin layer 310 improves adhesion with the insulating layer 200.

A solder resist 900 may be formed and an opening part may be formed therein. A build-up layer and a circuit pattern may be further formed to implement a multilayer printed circuit board if needed.

Figure 16:
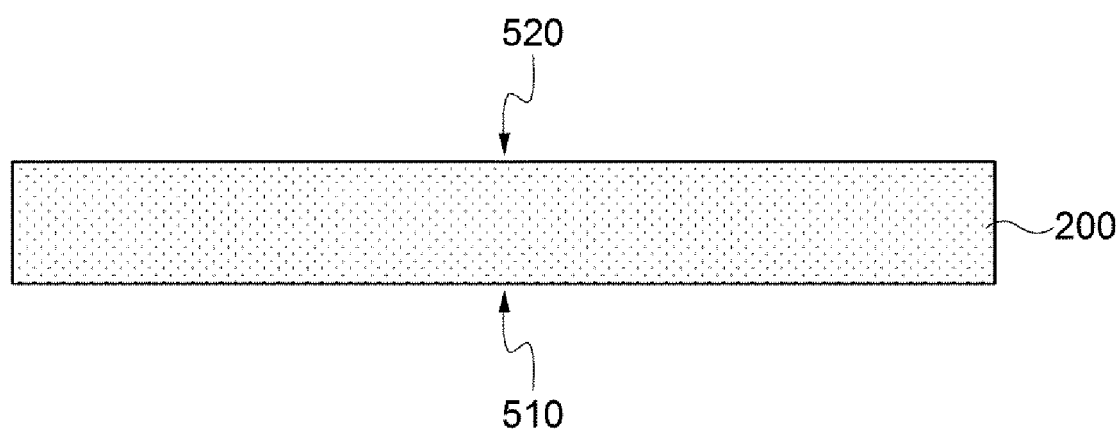
FIG. 16 illustrates a sectional view of an insulating layer formed according to a method for manufacturing a printed circuit board, in accordance with an embodiment.
Figure 17:
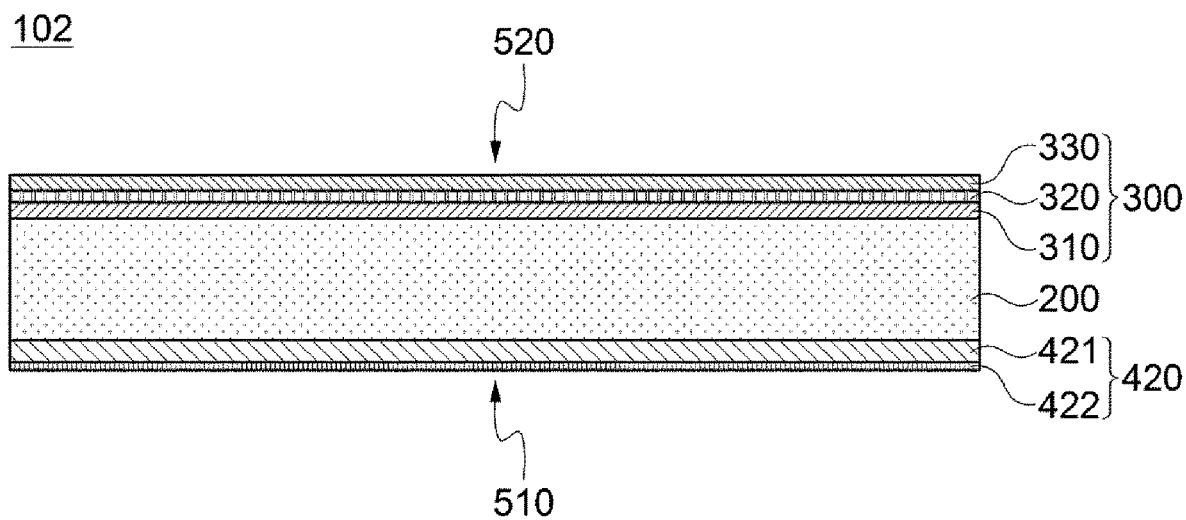
FIG. 17 illustrates a sectional view of a first copper clad layer and a second copper clad layer formed according to a method for manufacturing a printed circuit board, in accordance with an embodiment.
Figure 18:
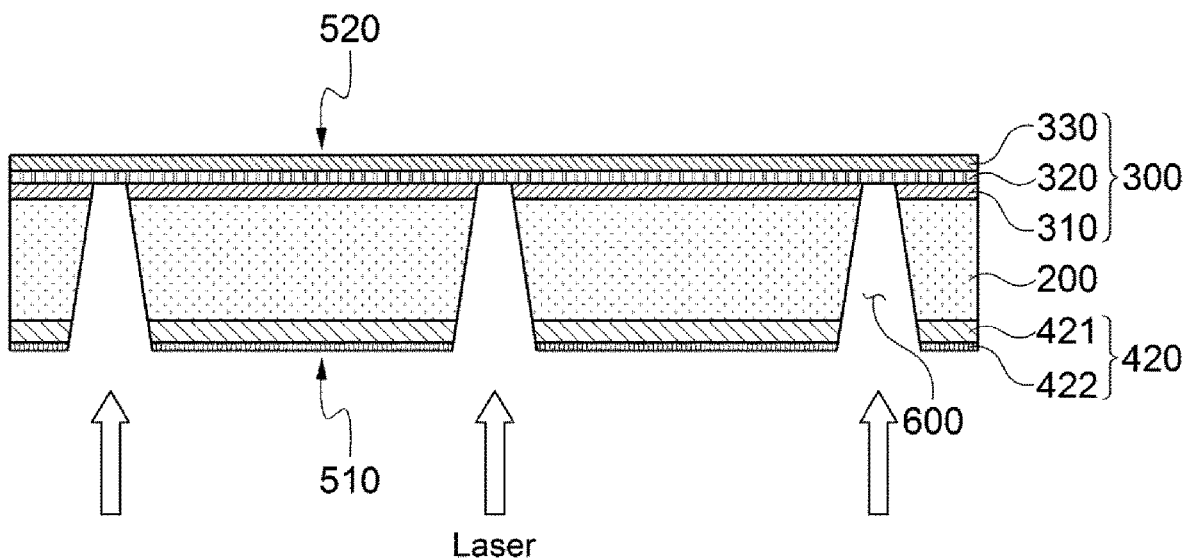
FIG. 18 illustrates a sectional view of a via hole formed using a laser according to a method for manufacturing a printed circuit board, in accordance with an embodiment.
Figure 19:
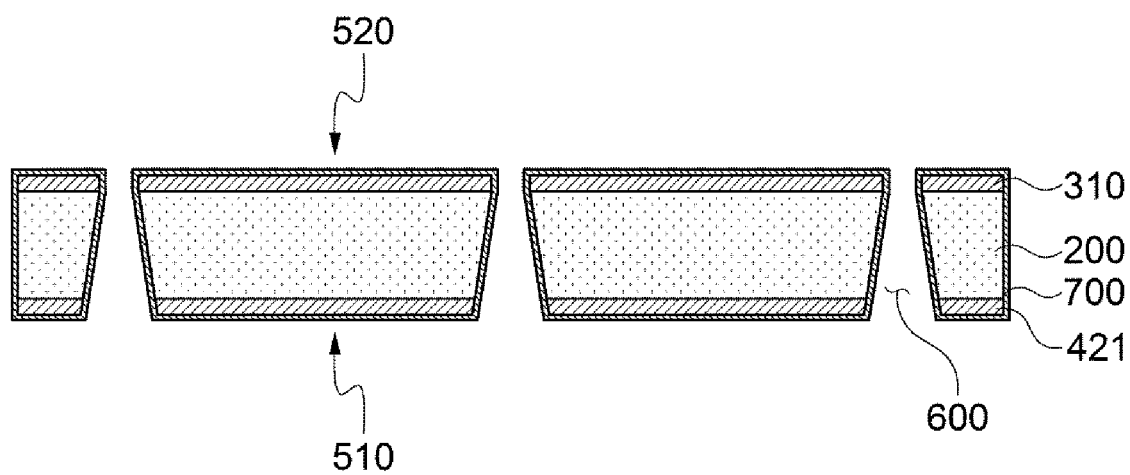
FIG. 19 illustrates a sectional view of a seed layer formed according to a method for manufacturing a printed circuit board, in accordance with an embodiment.

FIG. 16 illustrates a sectional view of an insulating layer formed according to a third example of a method for manufacturing a printed circuit board. FIG. 17 illustrates a sectional view of a first copper clad layer and a second copper clad layer formed according to a third example of a method for manufacturing a printed circuit board. FIG. 18 illustrates a sectional view of a via hole formed using a laser according to a third example of a method for manufacturing a printed circuit board. FIG. 19 illustrates a sectional view of a seed layer formed according to a third example of a method for manufacturing a printed circuit board. FIG. 20 illustrates a sectional view of a fine circuit pattern and a solder resist formed according to a third example of a method for manufacturing a printed circuit board.

Referring to FIGS. 16-20, a method for manufacturing a printed circuit board according to an example includes forming a copper clad laminate by forming a first copper clad layer including an ultra-thin copper foil on which a nickel oxide or a cobalt oxide is coated on a first surface of an insulating layer, and a second copper clad layer including a polymer resin layer, a carrier foil layer and a second copper layer on a second surface of the insulating layer; forming a via hole on the surface of the first copper clad layer; eliminating the second copper clad layer except the polymer resin layer and forming a copper seed layer after etching the first copper clad layer; and forming a fine circuit pattern and forming a via and an outer circuit on the first surface. Forming of the via hole may comprise irradiating laser on the surface of the second copper clad layer. Forming of the copper seed layer may comprise electroless plating after etching the first copper clad layer. Forming of the circuit pattern may comprise a semi-additive process.

A process to form a copper clad laminate by forming a first copper clad layer 420 including an ultra-thin copper foil on which a nickel oxide or a cobalt oxide is coated on the first surface 510 of the insulating layer 200, and a second copper clad layer 300 including a polymer resin layer 310, a second copper layer 320 and a carrier foil layer 330 on the second surface 520 of the insulating layer 200 may include forming a first copper clad layer 400 by laminating an ultra-thin copper foil 421 and a metallic oxide coating layer 422 composed of nickel oxide or cobalt oxide in order outwardly from the first surface 510 of the insulating layer 200 and forming a second copper clad layer 300 on the second surface 520.

The second copper clad layer 300 is formed by sequentially laminating the polymer resin layer 310, the second copper layer 320, and the carrier foil layer 330 outwardly from the second surface 520 of the insulating layer 200.

The metallic oxide coating layer 422 is formed by coating the ultra-thin copper foil 421 with nickel oxide or cobalt oxide to increase laser absorbance.

A process to form a via hole by irradiating the surface of the first copper clad layer with a laser includes forming a via hole 600 by irradiating the laser to the first surface of the copper clad laminate 102 of FIG. 17.

The laser may be a YAG laser, a $CO_2$ laser or a pico-laser, but it may not be limited thereto.

In some examples, a $CO_2$ laser, which performs the process at a relatively low cost, may be used because the absorbance of the laser through the metallic oxide coating layer 421 may be increased, thereby reducing the cost of the process without affecting the L/S of the circuit pattern.

When a via hole is made using laser, a diameter of the bottom part of the via hole is generally smaller than that of the entrance part. However, in this example, because the via hole is formed from the first surface 510 to the second surface 520 of the copper clad laminate, the diameter of the entrance part of the via hole from the second surface 520 is smaller which allows forming fine via holes 600 and further forming fine vias 610 and fine patterns 810 on the second surface 520.

The via hole 600 is etched to the polymer resin layer 310.

A process to eliminate the second copper clad layer, except the polymer resin layer and forming a copper seed layer by electroless plating after etching the first copper clad layer may include eliminating the second copper layer 320 and the carrier foil layer 330 using a detaching process and the first copper clad layer 400 using an etching process.

In some examples, the metallic oxide coating layer 422 of the first copper clad layer may be completely eliminated, but the ultra-thin copper foil 421 may not be completely eliminated as shown in FIG. 19. In such examples, the remaining ultra-thin copper foil 421 improves the adhesion between the copper seed layer and the insulating layer when the copper seed layer is formed by electroless plating.

The copper seed layer 700 on the other surface 520 is formed by electroless plating. In this example, the copper seed layer 700 may function as a seed layer to form an outer circuit pattern 800, a fine pattern 810, and the via 610.

The copper seed layer 700 on the other surface 520 is plated on the polymer resin layer 310 to facilitate forming the fine pattern 810 through the semi-additive process because the polymer resin layer 310 improves adhesion with the insulating layer 200.

A solder resist 900 is formed and an opening part is formed therein. A build-up layer and a circuit pattern may be further formed to implement a multilayer printed circuit board if needed.

Figure 21:
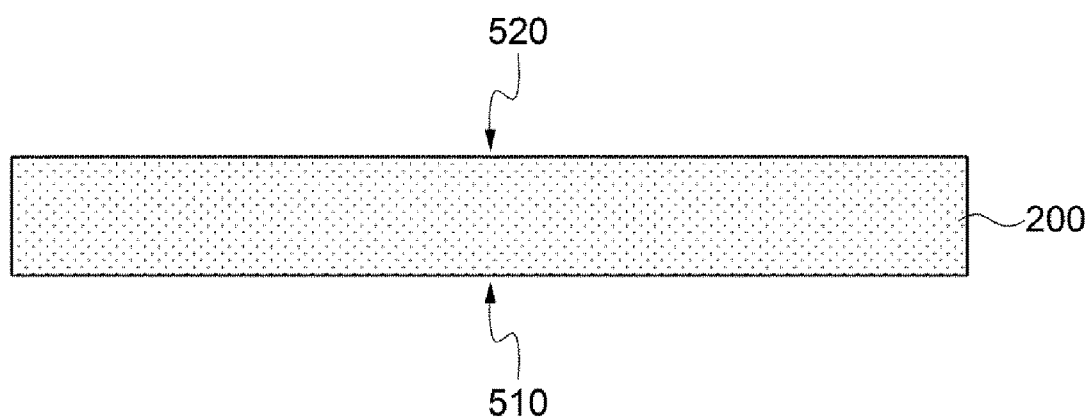
FIG. 21 illustrates a sectional view of an insulating layer formed according to a method for manufacturing a printed circuit board, in accordance with an embodiment.
Figure 22:
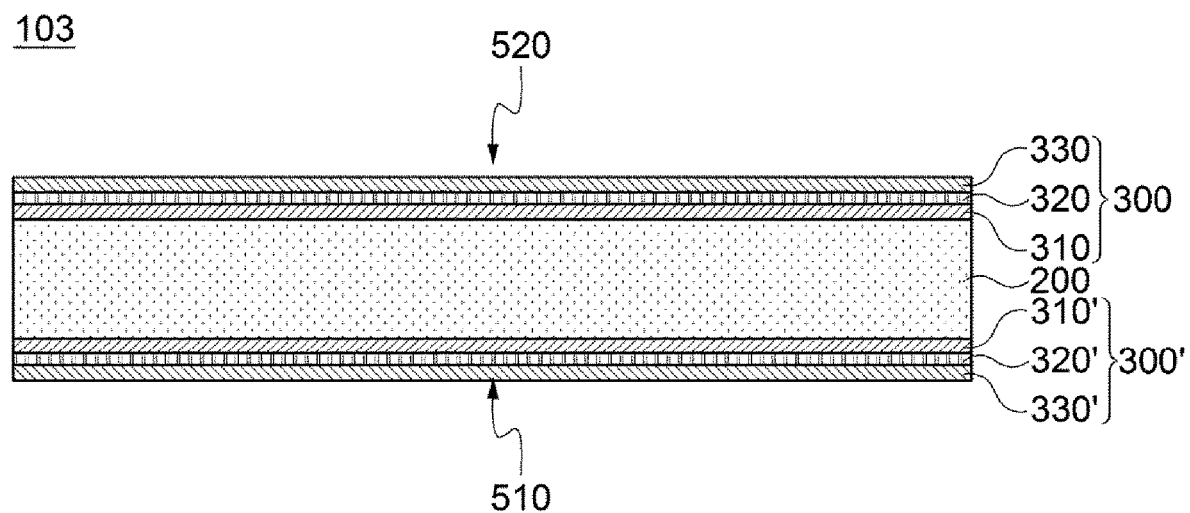
FIG. 22 illustrates a sectional view of second copper clad layers formed on one surface and the other surface of the insulating layer formed according to a method for manufacturing a printed circuit board, in accordance with an embodiment.
Figure 23:
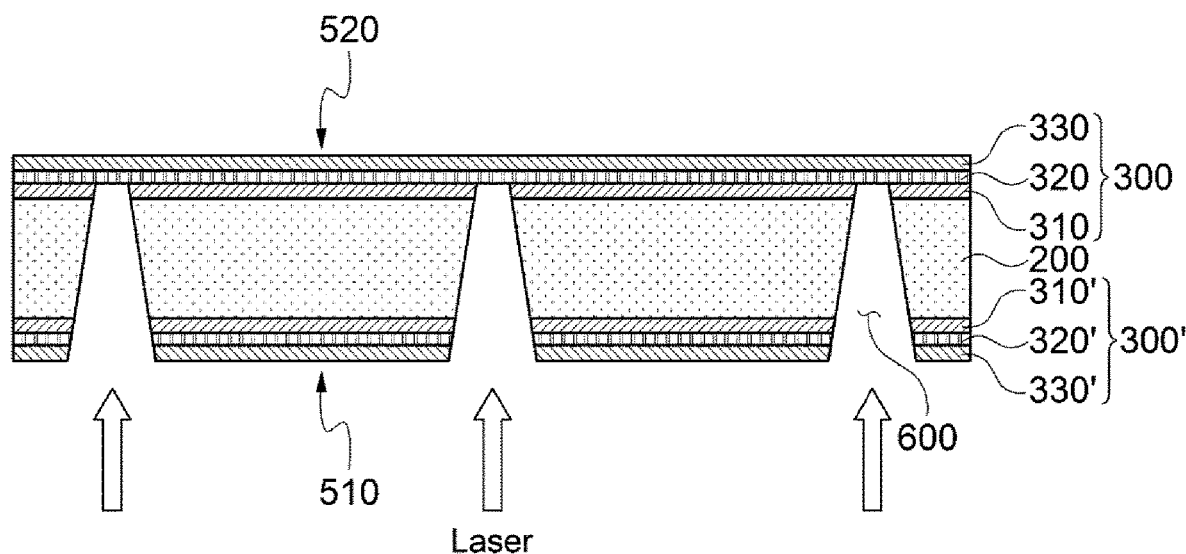
FIG. 23 illustrates a sectional view of a via hole formed using a laser according to a method for manufacturing a printed circuit board, in accordance with an embodiment.
Figure 24:
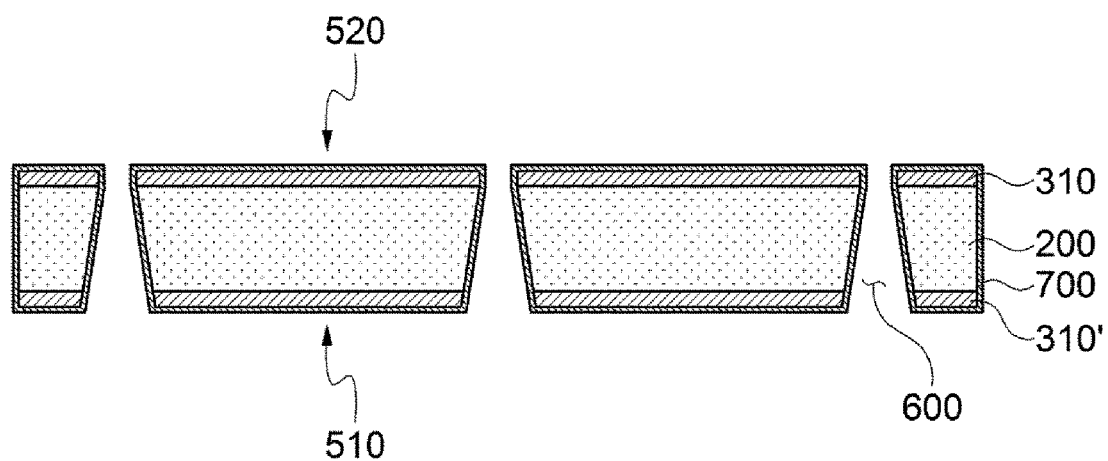
FIG. 24 illustrates a sectional view of a seed layer formed according a method for manufacturing a printed circuit board, in accordance with an embodiment.

FIG. 21 illustrates a sectional view of an insulating layer formed according to a fourth example of a method for manufacturing a printed circuit board. FIG. 22 illustrates a sectional view of second copper clad layers formed on a first surface and a second surface of the insulating layer formed according to a fourth example of a method for manufacturing a printed circuit board. FIG. 23 illustrates a sectional view of a via hole formed using a laser according to a fourth example of a method for manufacturing a printed circuit board. FIG. 24 illustrates a sectional view of a seed layer formed according to a fourth example of a method for manufacturing a printed circuit board. FIG. 25 illustrates a sectional view of a fine circuit pattern and a solder resist formed on the first surface and the second surface of the insulating layer formed according to a fourth example of a method for manufacturing a printed circuit board.

Referring to FIGS. 21-25, a method for manufacturing a printed circuit board, according to an example, includes forming a copper clad laminate by forming a first copper clad layer including a polymer resin layer, a carrier foil layer and a copper layer on the first surface of the insulating layer and a second copper clad layer including a polymer resin layer, a carrier foil layer and a copper layer on the second surface of the insulating layer; forming a via hole on the first surface of the second copper clad layer; eliminating the second copper clad layer except the polymer resin layer and forming a copper seed layer after etching the first copper clad layer; and forming a fine circuit pattern and forming a via and an outer circuit on the first surface and the second surface. Forming of the via hole may comprise irradiating laser on the surface of the second copper clad layer. Forming of the copper seed layer may comprise electroless plating after etching the first copper clad layer. Forming of the circuit pattern may comprise a semi-additive process.

A process to form a copper clad laminate by forming a first copper clad layer including a polymer resin layer, a carrier foil layer and a copper layer on the first surface of the insulating layer and a second copper clad layer including a polymer resin layer, a carrier foil layer and a copper layer on the second surface of the insulating may include forming a copper clad laminate 103 by laminating sequentially polymer resin layers 310, 310', copper layers 320, 320', and carrier foil layers 330, 330' outwardly from the first surface 510 and the second surface 520 of the insulating layer 200, respectively.

A process to form a via hole by irradiating laser on the first surface of the second copper clad layer includes forming a via hole 600 by irradiating laser on the first surface of the second copper clad layer 300' formed on the first surface 510 of the copper clad laminate.

The via hole 600 is etched to the polymer resin layer 310 of the second copper clad layer 300 formed on the second surface 520.

The laser may be a YAG laser, a CO₂ laser or a pico-laser, but it may not limited thereto.

A process to eliminate the second copper clad layer, except the polymer resin layer, and forming a copper seed layer by electroless plating after etching the first copper clad layer may include eliminating the second copper layers 320, 320' and the carrier foil layers 330, 330' using a detaching process and forming the copper seed layer using an electroless plating.

A fine circuit pattern may be formed on the first surface and the second surface through the semi-additive process and then a via and an outer circuit may be formed.

The polymer resin layers 310, 310' remained on both surfaces 510, 520 of the insulating layer 200 may facilitate forming the fine pattern 810, 810' through the semi-additive process.

Forming a solder resist may be further processed.

While this disclosure includes specific examples, it will be apparent to one of ordinary skill in the art that various changes in form and details may be made in these examples without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A copper clad laminate, comprising:
   a first copper clad layer made of copper directly disposed on a first outer surface of an insulating layer comprising a reinforcing material, a filler and a resin; and
   a second copper clad layer directly disposed on a second outer surface of the insulating layer opposite the first outer surface of the insulating layer,
   wherein the second copper clad layer comprises a polymer resin layer directly disposed on the second outer surface of the insulating layer, a second copper layer made of copper directly disposed on the polymer resin layer, and a carrier foil layer directly disposed on the second copper layer,
   wherein the first copper clad layer is an exposed exterior of the copper clad laminate,
   wherein the polymer resin layer consists of at least one selected from the group consisting of a polyamide-imide, a liquid crystal polymer, a cyclic olefin polymer and a mixture thereof, and
   wherein the carrier foil layer comprises a benzotriazole-based organic remover or a metallic remover as a remover coating.

2. The copper clad laminate of claim 1, wherein the reinforcing material is at least one selected from the group consisting of glass fiber fabrics, glass fiber nonwovens, carbon fiber fabrics and organic polymer fiber fabrics.

3. The copper clad laminate of claim 1, wherein the filler is at least one selected from the group consisting of silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, calcium zirconate and a mixture thereof.

* * * * *